United States Patent
Sudo et al.

(10) Patent No.: US 7,567,601 B1
(45) Date of Patent: Jul. 28, 2009

(54) SEMICONDUCTOR LASER HAVING LOW STRESS PASSIVATION LAYER

(75) Inventors: Tsurugi Sudo, San Jose, CA (US); Ashish Verma, San Jose, CA (US); Jing Chai, Fremont, CA (US); Sumesh Mani K. Thiyagarajan, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/749,047

(22) Filed: May 15, 2007

Related U.S. Application Data

(60) Provisional application No. 60/747,295, filed on May 15, 2006.

(51) Int. Cl.
*H01S 5/00* (2006.01)
(52) U.S. Cl. ............... 372/43.01; 372/45.01; 372/46.01
(58) Field of Classification Search ............... 372/43.01, 372/46.01
See application file for complete search history.

(56) References Cited

U.S. PATENT DOCUMENTS

| | | | |
|---|---|---|---|
| 4,092,659 | A | 5/1978 | Ettenberg |
| 4,740,987 | A | 4/1988 | McCall et al. |
| 4,859,628 | A | 8/1989 | Knight et al. |
| 4,951,292 | A | 8/1990 | Kuindersma et al. |
| 5,208,821 | A | 5/1993 | Berger et al. |
| 5,450,432 | A | 9/1995 | Okuda |
| 5,675,601 | A | 10/1997 | Karakida et al. |
| 5,793,787 | A | 8/1998 | Meyer et al. |
| 6,219,366 | B1 | 4/2001 | Furushima |
| 6,618,410 | B1 | 9/2003 | Fischer et al. |
| 2002/0037024 | A1 | 3/2002 | Huang |
| 2002/0114367 | A1 | 8/2002 | Stintz et al. |
| 2002/0117675 | A1 | 8/2002 | Mascarenhas |
| 2003/0002557 | A1 | 1/2003 | Eng et al. |
| 2003/0179795 | A1* | 9/2003 | Moriya et al. .................. 372/46 |

(Continued)

FOREIGN PATENT DOCUMENTS

JP        2000-340894        12/2000

(Continued)

OTHER PUBLICATIONS

Sexl, M., Bohm G., Maier, M., Tranke, G., Weimann, G., & Abstreiter, G. (1997), MBE Growth of Metamorphic In(Ga)AlAs Buffers. 1997 IEEE International Symposium on Compound Semiconductors, IEEE, 49-52.

(Continued)

*Primary Examiner*—Dung T Nguyen
(74) *Attorney, Agent, or Firm*—Workman Nydegger

(57) ABSTRACT

A laser diode having a composite passivation layer configured to control parasitic capacitance, especially in high speed laser applications, is disclosed. In one embodiment, a ridge waveguide laser is disclosed and includes: a substrate, an active layer disposed on the substrate, a ridge structure disposed on the active layer, and a contact layer disposed on the ridge structure. A composite passivation layer is disposed substantially laterally to the ridge structure. The composite passivation layer includes a silicon nitride bottom layer, a silicon nitride top layer, and a silicon dioxide middle layer interposed between the bottom and top layers. The passivation layers possess differing stress components that, when combined, cancel out the overall mechanical stress of the passivation layer. This enables relatively thick passivation layers to be employed in high speed laser diodes without increasing the risk of layer stress cracking and laser damage.

15 Claims, 5 Drawing Sheets

U.S. PATENT DOCUMENTS

2004/0079967 A1    4/2004    Shakuda et al.
2004/0086017 A1    5/2004    Yoshida et al.
2004/0190835 A1    9/2004    Burdick et al.
2005/0031000 A1    2/2005    Botez

OTHER PUBLICATIONS

Ha, Yuk Lung, et al., Epitaxial Regrowth in a Distributed Feedback Laser, U.S. Appl. No. 11/749,007, filed May 15, 2007.

Verma, Ashish K., et al., Thin INP Spacer Layer in a High Speed Laser for Reduced Lateral Current Spreading, U.S. Appl. No. 11/749,033, filed May 15, 2007.

Dimitrov, Roman, et al., Method for Applying Protective Laser Facet Coatings, U.S. Appl. No. 11/749,052, filed May 15, 2007.

Dimitrov, Roman, et al., High Resistivity Engineered Laser Facet Coatings, U.S. Appl. No. 11/749,057, filed May 15, 2007.

Dimitrov, Roman, et al., Laser Facet Pre-Coating Etch for Controlling Leakage Current, U.S. Appl. No. 11/749,061, filed May 15, 2007.

Young, David Bruce, et al., Semiconductor Laser Having a Doped Active Layer, U.S. Appl. No. 11/749,013, filed May 15, 2007.

U.S. Appl. No. 11/749,013, mailed Oct. 29, 2008, Office Action.

U.S. Appl. No. 11/749,013, mailed Feb. 25, 2009, Notice of Allowance.

U.S. Appl. No. 11/749,033, mailed Jun. 2, 2008, Office Action.

U.S. Appl. No. 11/749,033, mailed Jan. 13, 2009, Notice of Allowance.

U.S. Appl. No. 11/749,007, mailed Dec. 9, 2008, Office Action.

U.S. Appl. No. 11/749,057, mailed Dec. 11, 2008, Office Action.

\* cited by examiner

SEMICONDUCTOR LASER HAVING LOW STRESS PASSIVATION LAYER

CROSS-REFERENCE TO RELATED APPLICATIONS

This application claims the benefit of the U.S. Provisional Patent Application No. 60/747,295, filed May 15, 2006, and entitled "SEMICONDUCTOR LASER HAVING LOW STRESS PASSIVATION LAYER," which is incorporated herein by reference in its entirety.

BACKGROUND

1. Technology Field

The present invention generally relates to semiconductor optical sources. In particular, the present invention relates to a laser device having a passivation layer that reduces parasitic capacitance while also minimizing mechanical stress components of the laser in order to preserve the integrity and structure of the device, especially with regard to lasers configured for high data rate operation.

2. The Related Technology

Semiconductor lasers are currently used in a variety of technologies and applications, including communications networks. Generally, lasers produce a stream of coherent, monochromatic light by stimulating photon emission from a solid state material. Fabry-Perot ("FP") and distributed feedback ("DFB") lasers are exemplary laser designs commonly used in optical transmitters, which are responsible for modulating electrical signals into optical signals for transmission via a communications network, for instance.

Semiconductor optical sources, such as the lasers described above, generally include a passivation layer that covers selected portions of the device so as to electrically isolate it from adjacent devices, and to environmentally protect it from contamination, humidity, etc. Importantly, the passivation layer also reduces parasitic capacitance in the laser, enabling it operate as intended.

With the advent of ever-higher data rates in communications networks, lasers are being developed to operate at 2.5, 10, and higher Gigabit/second data rates. As laser data rate operability rises, so too does the required passivation layers thickness. Increase in passivation layer thickness is necessary to offset the increased influence of parasitic capacitance that is present during high-speed laser operation. Unfortunately, with an increase in passivation layer thickness comes increased mechanical stress that is introduced into the layer. Indeed, these mechanical stresses can be such that cracking or rupture of the passivation layer may occur, which can compromise the integrity of the laser, rendering it unusable.

In light of the above, a need exists in the art for a laser device having a passivation layer that can adequately protect the device from parasitic capacitance while not suffering from the above-described problems.

BRIEF SUMMARY

The present invention has been developed in response to the above and other needs in the art. Briefly summarized, embodiments of the present invention are directed to a laser diode having a composite passivation layer configured to control parasitic capacitance, especially in high speed laser applications, is disclosed.

In one embodiment, a ridge waveguide laser is disclosed and includes: a substrate, an active layer disposed on the substrate, a ridge structure disposed on the active layer, and a contact layer disposed on the ridge structure. A composite passivation layer is disposed substantially laterally to the ridge structure. The composite passivation layer includes a silicon nitride bottom layer, a silicon nitride top layer, and a silicon dioxide middle layer interposed between the bottom and top layers.

The passivation layers possess differing stress components that, when combined, cancel out the overall mechanical stress of the passivation layer. This enables relatively thick passivation layers to be employed in high speed laser diodes without increasing the risk of layer stress cracking and laser damage.

A method for manufacturing a laser die according to embodiments of the present invention is also disclosed. The method comprises defining a substrate and an active layer, then applying a first compressive layer of a composite passivation layer above at least a portion of the active layer. A tensile layer of the composite passivation layer is also applied above at least a portion of the active layer. A second compressive layer is applied atop the tensile layer to sandwich the tensile layer between compressive layers and complete the passivation layer.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-5 depict various features of embodiments of the present invention, which is generally directed to a semiconductor optical source, such as a laser diode having a passivation layer configured to reduce parasitic capacitance. The passivation layer is designed so as to have a thickness sufficient to prevent parasitic capacitance in high speed laser diodes that are used in optical transmitters, such as those found in optical transceiver modules, which operate at 2.5, 10, or higher Gigabit/second data rates. Moreover, the laser diode passivation layer is configured as a composite-layer structure, wherein the layers possess differing stress components that, when combined, tend to cancel out the overall mechanical stress, i.e., stress and/or strain, of the passivation layer. Cancellation of the passivation layer stress component enables relatively thick passivation layers to be employed in high speed laser diodes without increasing the risk of layer stress cracking and laser damage, which is prone to occur in prior known layer designs.

Note at the outset that the discussion to follow regarding embodiments of the present invention should not be construed as limiting the application to such embodiments. Indeed, devices and components apart from optical transmitters and transceiver modules that employ laser devices and other suitable light sources can also benefit from the teachings to be discussed herein.

1. Exemplary Operating Environment

Figure 1:
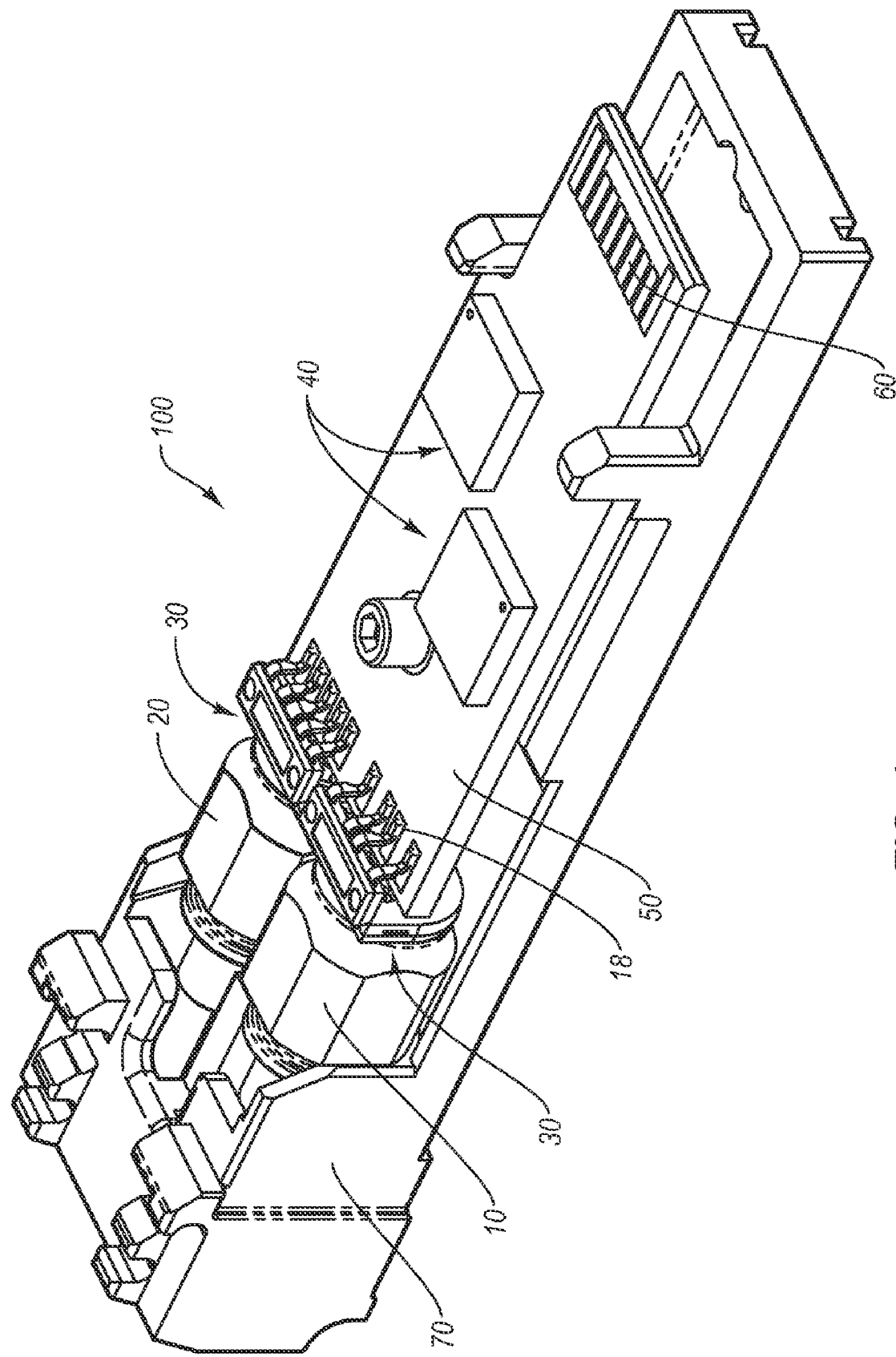
FIG. 1 is a perspective view of an optical transceiver module that is configured in accordance with one embodiment of the present invention.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While the optical transceiver 100 is described in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher bandwidth fiber optic links. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

2. Structural and Operational Aspects of Laser Having Composite Passivation Layer Together with FIG. 1 reference is now made to FIGS. 2 and 3. In general, the operating environment described above, including the transceiver 100 and TOSA 20, is exemplary of one environment in which principles of the present invention can be practiced. In particular, embodiments of the present invention disclose a laser device having a composite passivation layer that protects components of the laser while remaining free from the problems associated with prior passivation layer designs.

Figure 2:
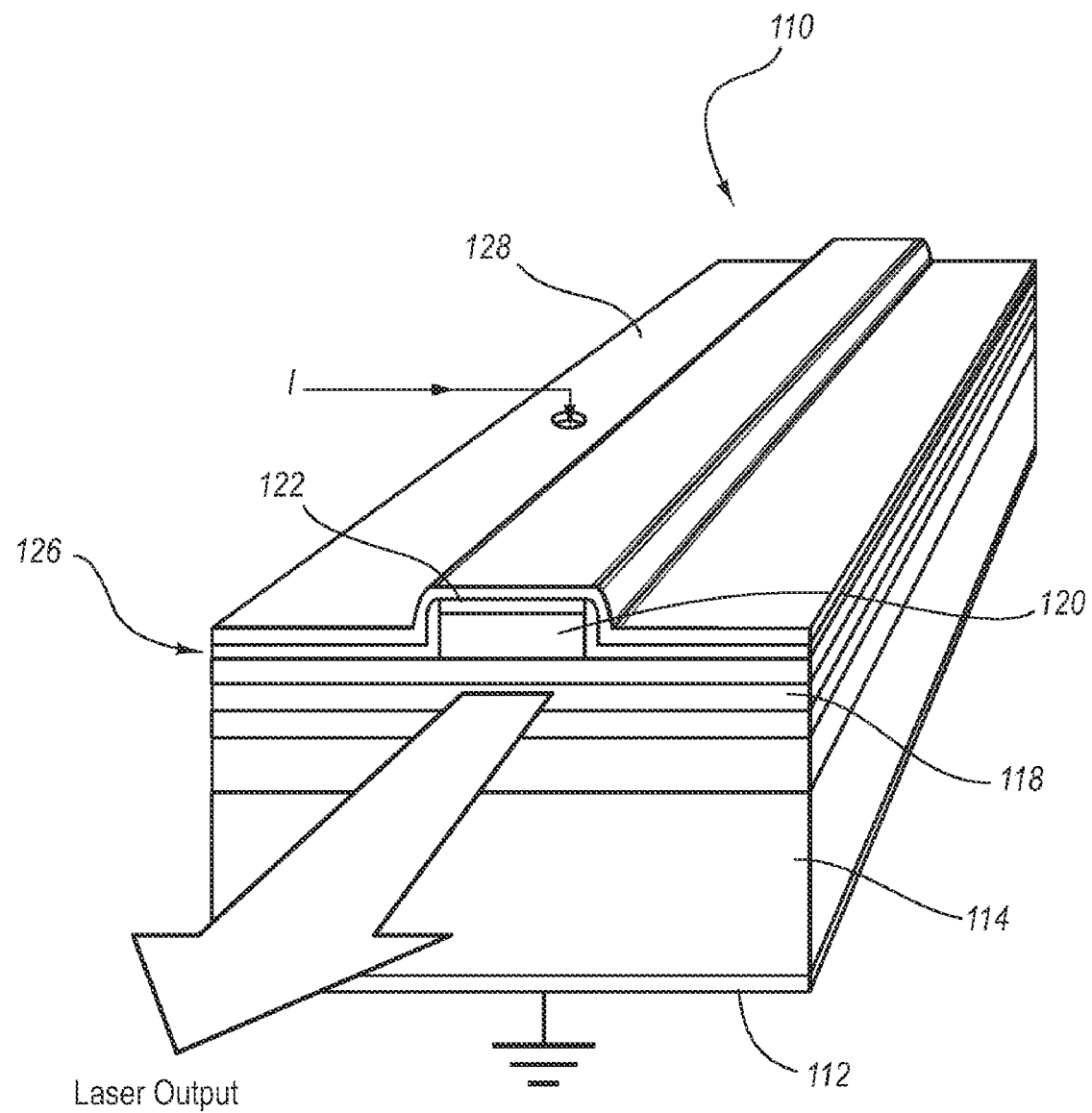
FIG. 2 is a simplified perspective view of a ridge waveguide laser configured in accordance with one embodiment.

FIG. 2 is a simplified view of a semiconductor laser, generally designated at 110, that includes various aspects of the present invention. The laser 110 shown in FIG. 2 is implemented as a distributed feedback "DFB" laser having a ridge waveguide ("RWG") design. This design notwithstanding, it should be noted that the principles of the present invention can be extended to other laser types, including Fabry-Perot and other edge-emitting laser types, vertical cavity surface emitting lasers, and other semiconductor optical sources where protective and/or passivation layers are employed. The description included herein, therefore, is not meant to limit the present invention in any way.

As shown in FIG. 2, the laser 110 generally includes a bottom electrical contact 112 and a substrate 114 disposed atop the bottom electrical contact. An active layer 118 is disposed above the substrate 114, and a ridge 120 is positioned above the active layer 118, in accordance with the RWG design. The ridge 120 in present embodiments can be composed of InP, InGaAsP, or other suitable materials. A contact layer 122 is included atop the ridge 120. Also as shown, a composite passivation layer, generally designated at 126, is positioned above the active layer 118 and laterally to either side of the ridge 120. Including a bottom layer 126A, a middle layer 126 B, and a top layer 126C, the composite passivation layer 126 is described in further detail below. A top electrical contact 128 is included atop both the composite passivation layer 126 and contact layer 122. Output of a coherent optical signal produced at the active layer 118 is shown by the arrow extending from the laser 110 in FIG. 2.

Figure 3:
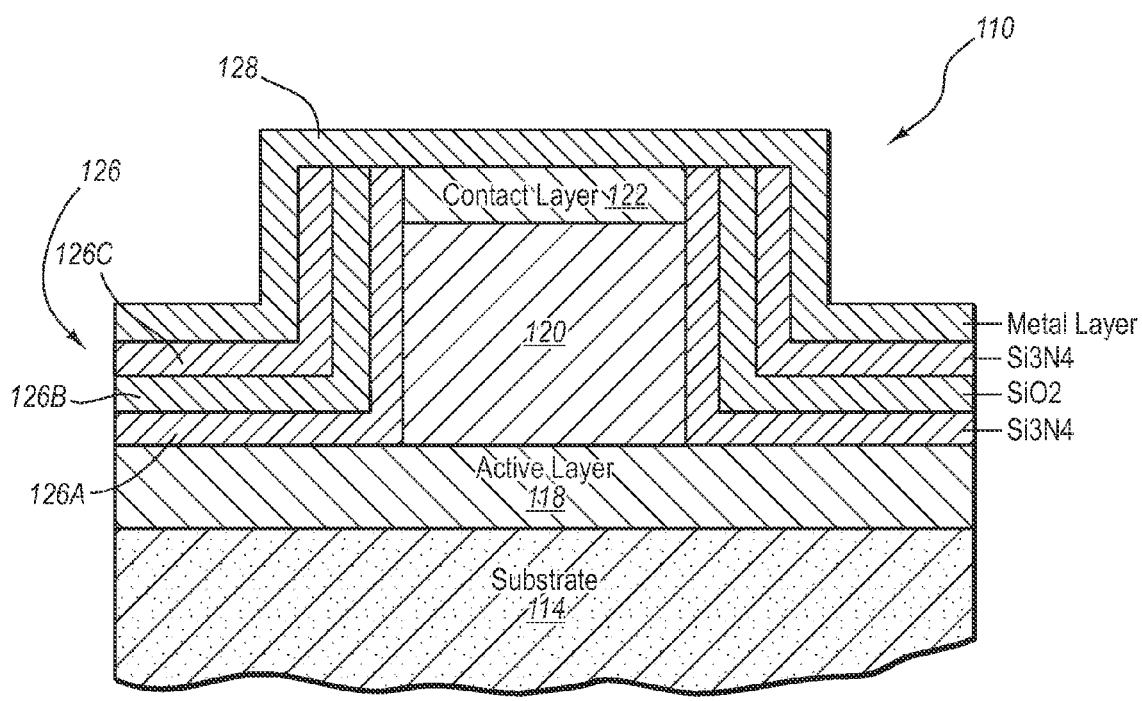
FIG. 3 is a cross sectional view of a ridge waveguide laser according to one embodiment of the present invention.

Reference is now made to FIG. 3, wherein further details regarding the composite passivation layer 126 are depicted. FIG. 3, which is a simplified cross sectional view of the laser 110 of FIG. 2, shows the composite passivation layer 126 positioned generally above the active layer 118 and laterally bordering the ridge 120 and contact layer 122. As mentioned, the composite passivation layer 126 electrically isolates the laser 110, and prevents humidity or other contamination from entering the laser interior. In addition, the composite passivation layer 126 is positioned so as to reduce parasitic capacitance that can undesirably affect operation of the laser.

In greater detail, the composite passivation layer 126 is configured to reduce or eliminate the mechanical stresses associated with the positioning of the layer in the laser 110. Such mechanical stresses are common when a sufficiently thick single passivation layer is employed in the laser. In accordance with one embodiment, the composite passivation layer 126 includes multiple layers that are deposited in such a way as to reduce or eliminate the mechanical stresses referred to above. As detailed above, in one embodiment three layers are included in the composite passivation layer 126: the bottom layer 126A, middle layer 126B, and top layer 126C. These layers are disposed atop one another such that the bottom and top layers 126A and C sandwich the middle layer 126B, i.e., such that the middle layer is interposed between the bottom and top layers.

Further, each layer of the composite passivation layer 126 is configured to have a particular stress component that will act to cancel out net stress of the composite passivation layer. In one embodiment, the sandwiching bottom and top layers 126A and C are composed of a silicon nitride composition SiNx, such as Si3N4, while the interposed middle layer is composed of silicon dioxide, SiO2. The bottom and top layers 126A and C of the composite passivation layer exhibit a compressive force within the composite layer structure, while the middle layer 126B exhibits a tensile force. The compressive forces of the bottom and top layers 126A and C cancel out the tensile force of the middle layer 126B when disposed as shown in FIG. 3. This desirably results in a passivation layer with substantially a net zero stress component. In turn, this reduces the likelihood of cracking or other stress-related damage from occurring in the composite passivation layer 126, thereby preventing damage to the laser 110.

The thicknesses of the each of the layers 126A, B, and C can be adjusted and tuned such that the layers of the composite passivation layer 126 effectively cancel out their respective stresses. Thus, the respective individual layer thicknesses can vary according to the required overall composite passivation layer thickness in order to protect the laser from parasitic capacitance. Individual layer thickness can also vary according to the layer materials used, deposition process used, process conditions, etc. The individual layers 126A, B, and C can be deposited on the laser surface using one or more suitable processes, including CVD and sputtering. For instance, one exemplary deposition procedure can involve combining a 5% pre-mixed dilute SiH4 solution in a SiNx deposition solution for application as either the bottom of top layers of the composite passivation layer. This and other methods and compositions are therefore contemplated as part of the present invention.

In other embodiments, it is possible to use fewer or more layers than what is shown in FIG. 3. For instance, two layers, one composed of silicon nitride, the other silicon dioxide can be used to form the composite passivation layer. Or five layers could be used in another embodiment. In one possible implementation, one or more layers of a silicon oxide-dinitride composition could be used to form the composite passivation layer. In yet another embodiment, the composite layer structure can be included in a laser that also includes a separate passivation layer, if desired.

Note that the layer configuration shown in FIG. 3 includes two dielectric Si3N4 layers sandwiching a dielectric SiO2 layer. However, other compositions apart from silicon nitride and silicon dioxide can be employed to perform the functionality as described above.

3. Details Regarding One Exemplary Laser Structure

Figure 4:
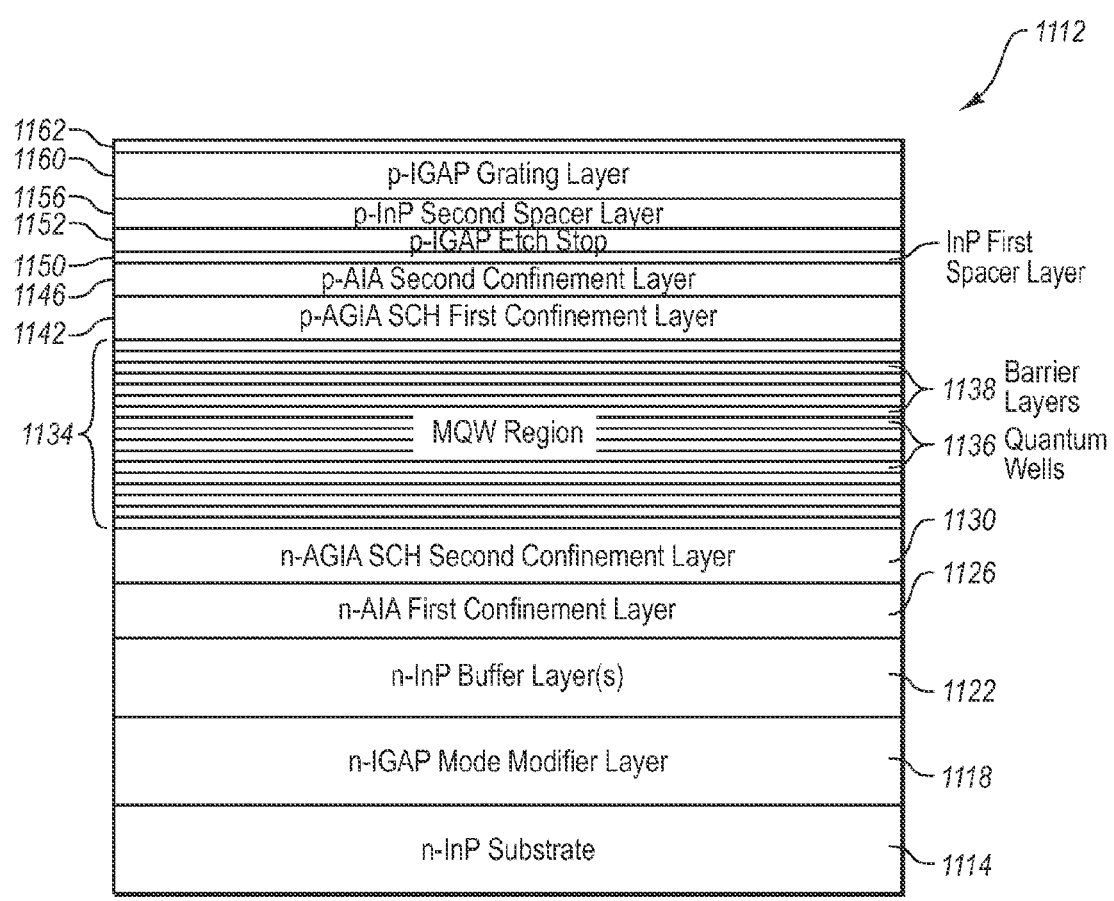
FIG. 4 is a cross sectional side view of an epitaxial base portion of a distributed feedback ("DFB") laser, according to one embodiment of the present invention.
Figure 5:
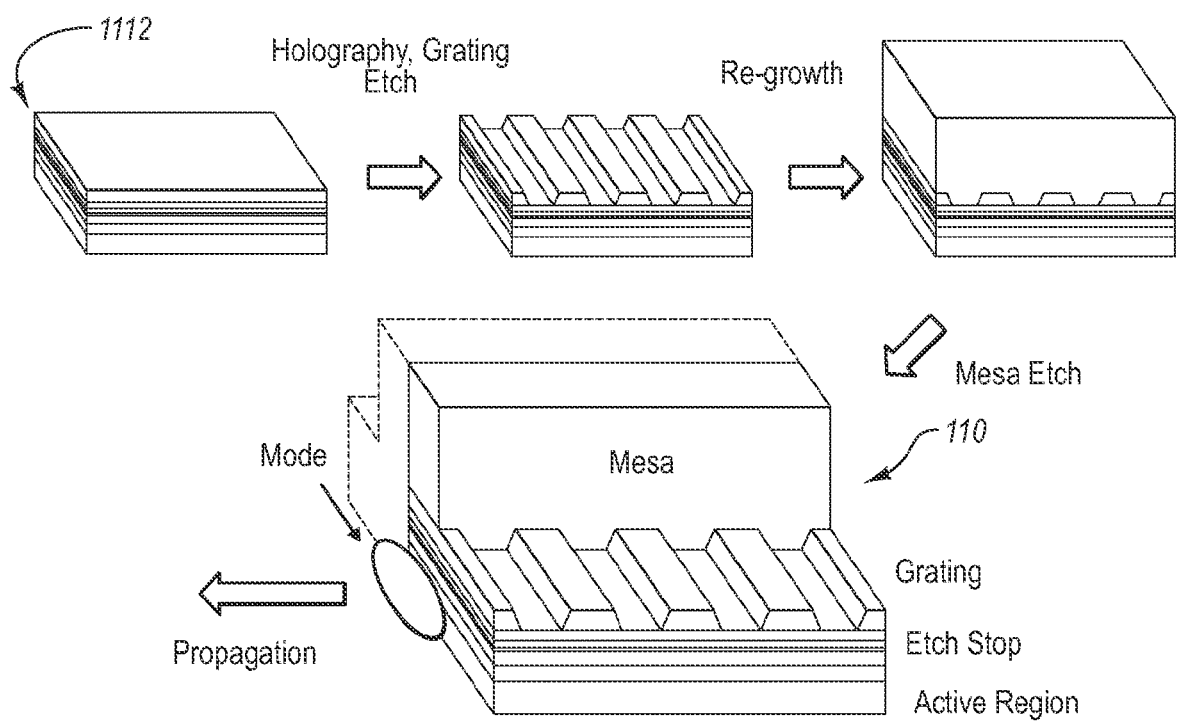
FIG. 5 is a progressive view of various processing and manufacturing stages performed on the epitaxial base portion shown in FIG. 4.

Reference is now made to FIGS. 4 and 5. In general, the operating environment described in connection with FIG. 1, including the transceiver 100 and TOSA 20, is exemplary of one environment in which a laser device, such as that depicted in FIGS. 2 and 3, produced in part according to principles of the present invention can be employed. FIGS. 4 and 5 describe various details of another example of a laser incorporating one embodiment of the present passivation layer configured to reduce parasitic capacitance.

As already mentioned, a distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10G") DFB laser configured for light emission at a wavelength of approximately 1310 nm. The following description includes both structural and functional characteristics of the 10G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way.

a. Base Epitaxial Layers

FIG. 4 illustrates layers of a base epitaxial portion 1112 of a 10G DFB laser, generally designated at 1110, at a stage prior to etching of the grating layers. The DFB laser 1110 is grown on an Indium Phosphide substrate (n-InP substrate) 1114.

A "mode modifier" layer (n-IGAP Mode Modifier) 1118 is grown on top of the substrate 1114 using Indium Gallium Arsenide Phosphide at an approximate thickness of 120 nm. This layer functions to reduce the power of second-order transversal modes that propagate within the laser structure. In particular, the mode modifier layer 1118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 1122 is made of Indium Phosphide and grown on top of the "mode modifier" layer 1118. This buffer layer is approximately 1.4 µm thick and provides a surface on which the n-layers of the laser are grown.

A first n-confinement layer 1126 of Aluminum Indium Arsenide (n-AIA) is grown at a thickness of approximately 20 nm on the buffer layer and is doped with silicon. A second n-confinement layer 1130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 1130 is graded to improve the confinement characteristics of the layer. The thicknesses of these n-layers were designed to be thin in order to optimize the thermal performance of the laser.

A multi-quantum well active region (MQW region) 1134 is grown on the n-type confinement layers. The active region 1134 is designed to have eight wells 1136 with corresponding wavelengths of ~1295 nm. Quantum barriers 1138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. The present well design is intentionally manufactured so that a complete cancellation of strain does not occur, but a small amount of strain remains for performance reasons.

In addition, the layers of the MQW region 1134 are intentionally doped with Zn, to maintain a low-level p-type doping. This is done to assure that the p-n junction of the laser diode always occurs in the same place, and is not made variable by unpredictable dopant diffusion processes.

A first p-confinement layer 1142 of Aluminum Gallium Indium Arsenide (p-AGIA SCH) is grown on the active region at a thickness of 30 nm and is doped with zinc. A second p-confinement layer 1146 of Aluminum Indium Arsenide (p-AIA) is grown at a thickness of 20 nm on the p-AGIA SCH layer and is also doped with zinc. Both of the p-layers are confinement layers and effectively maintain holes within the active region so that photons are produced. The p-AGIA SCH layer 142 is graded to improve the confinement characteristics of the layer. The thicknesses of these p-layers were designed to be thin in order to optimize the speed and thermal performance of the laser.

A spacer layer 1150 is located above the p-confinement layers. This spacer layer is made of Indium Phosphide and is approximately 5 nm in thickness. The thinness of the spacer layer improves the coupling efficiency of the grating and improves the speed of the laser. In particular, the spacer layer effectively controls the degree to which lateral current spreading occurs between the bottom of the ridge mesa and the active region.

Various "above-active" grating layers are located above the spacer layer. An etch stop layer (p-IGAP etch stop) 1152 made of Indium Gallium Arsenide Phosphide and having a thickness of 15 nm is grown on the spacer layer 1150. This etch stop layer is provided for stopping the mesa etch.

A second spacer layer 1156 is provided to separate the etch stop layer 1152 and the grating layer. In the illustrated design, the grating etch step is timed to stop within this spacer layer. The layer is made of Indium Phosphide (p-InP) at a thickness of 25 nm.

A grating layer (p-IGAP) 160 is grown on the second spacer layer 1156 and is made of Indium Gallium Arsenide Phosphide at a thickness of 30 nm. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the DFB laser 1110 can support two degenerate longitudinal grating modes because the grating formed in the grating layer 1160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 1162 is provided above the grating layer on which regrowth of other layers is performed. This top layer is a thin layer of Indium Phosphide.

b. Grating Fabrication and Regrowth

FIG. 5 illustrates various grating fabrication and subsequent regrowth stages employed in forming portions of the structure of the DFB laser 1110. In particular, FIG. 5 shows a side view of the base epitaxial structure 1112 of FIG. 4, together with subsequent grating fabrication and regrowth of the DFB laser 1110. As described above and by way of brief overview, a wet etch is performed to etch periodic gaps within the grating layer. After the etch is completed and the grating teeth are created, thick Indium Phosphide is grown on the etched, base epitaxial structure, in order to fill the gaps with low-index InP and also to form the mesa layer. The regrowth is completed with an Indium Gallium Arsenide layer for electrical contact.

This regrowth Indium Phosphide is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth that creates ridges to define the mesa of the DFB laser. Both dry and wet etching is used in creating the mesa ridges.

After the etching process, a dielectric layer is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa. Further details regarding this structure have been given in connection with the discussion relating to FIG. 3, above.

The dielectric layer is removed from the top of the mesa to allow an electrical contact and metallic layer to be placed on the mesa. Electrical contact is made by depositing metal onto the Indium Gallium Arsenide layer at the top of the mesa. This contact is both a non-alloy contact and a low penetration contact.

A metallic layer is placed on the electrical contact to which electrical current may be provided to the laser structure. In the present embodiment, the metallic layer is made of three sublayers of titanium, platinum and gold. A titanium layer is placed directly on the electrical contact layer, then a platinum layer and a gold layer is applied. This metallic layer provides sufficient conductivity to the Indium Gallium Arsenide layer so that current can be properly provided to the laser structure.

Bottom electrical contacts are generated by thinning the InP substrate and placing an n-type metallic layer on the bottom.

A DFB laser is removed from a wafer using common techniques by cleaving and breaking the wafer both horizontally and laterally to separate each laser. After this process, AR and HR coating is performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which couples into optical fiber. A minority of the optical power is emitted from the back of the laser which may couple with a photodetector (not shown) that is used to monitor the laser performance.

In one embodiment, the coating is made of layers of Silicon Oxide and Silicon. The reflectivity of the AR coating is designed to be less that 0.5% and the HR coating is designed to be approximately 96%. Once the coating process is complete, a testing process is performed in which the power characteristics and optical spectrum are tested.

The DFB laser 1110 and photodetector are packaged into an optical sub-assembly, which is subsequently packaged into an optical module along with driver and control integrated circuits.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A laser die, comprising:
    a substrate;
    an active layer disposed above the substrate; and
    a composite passivation layer disposed above at least a portion of the active layer, the composite passivation layer including at least:
        a first compressive layer;
        at least one tensile layer; and
        a second compressive layer.

2. The laser die as defined in claim 1, wherein the at least one compressive layer and the at least one tensile layer cooperate to cancel out net mechanical stress otherwise present in the composite passivation layer.

3. The laser die as defined in claim 1, wherein the at least one compressive layer is adjacent the at least one tensile layer.

4. The laser die as defined in claim 1, wherein the at least one tensile layer is interposed between the compressive layers.

5. The laser die as defined in claim 1, wherein the at least one compressive layer is composed of silicon nitride.

6. The laser die as defined in claim 1, wherein the at least one tensile layer is composed of silicon dioxide.

7. The laser die as defined in claim 1, wherein the laser die is a ridge waveguide laser.

8. The laser die as defined in claim 7, wherein the composite passivation layer is laterally disposed with respect to a ridge of the ridge waveguide laser.

9. The laser die as defined in claim 1, wherein the laser die is a distributed feedback laser.

10. A method for manufacturing a laser die, the method comprising:
    defining a substrate and an active layer;
    applying a first compressive layer of a composite passivation layer above at least a portion of the active layer;
    applying a tensile layer of the composite passivation layer above at least a portion of the active layer and on the compressive layer; and
    applying a second compressive layer of the composite passivation layer so as to sandwich the tensile layer between the first and second compressive layers.

11. The method for manufacturing as defined in claim 10, wherein applying the first compressive layer and tensile layer is performed by chemical vapor deposition.

12. The method for manufacturing as defined in claim 10, wherein applying the first compressive layer further comprises:
    combining a 5% pre-mixed dilute SiH4 solution III a SiNx deposition solution.

13. The method for manufacturing as defined in claim 10, further comprising:
    defining a ridge above the active layer; and
    applying the composite passivation layer adjacent the ridge.

14. The method for manufacturing as defined in claim 13, further comprising:
    applying a metal layer atop the composite passivation layer; and
    applying a contact layer atop the ridge.

15. The method for manufacturing as defined in claim 10, further comprising:
    configuring a thickness of at least one of the layers of the composite passivation layer so as to control parasitic capacitance of the laser die.

* * * * *